(12) United States Patent
Bain

(10) Patent No.: US 7,613,991 B1
(45) Date of Patent: Nov. 3, 2009

(54) METHOD AND APPARATUS FOR CONCURRENT CALCULATION OF CYCLIC REDUNDANCY CHECKS

(75) Inventor: Peter Bain, Ottawa (CA)

(73) Assignee: Altera Corporation, San Jose, CA (US)

( * ) Notice: Subject to any disclaimer, the term of this patent is extended or adjusted under 35 U.S.C. 154(b) by 291 days.

(21) Appl. No.: 11/674,096

(22) Filed: Feb. 12, 2007

Related U.S. Application Data

(63) Continuation-in-part of application No. 10/644,223, filed on Aug. 19, 2003, now Pat. No. 7,320,101.

(51) Int. Cl.
 *H03M 13/09* (2006.01)
(52) U.S. Cl. .................................................. 714/807
(58) Field of Classification Search .................. 714/807
 See application file for complete search history.

(56) References Cited

U.S. PATENT DOCUMENTS

| 3,634,883 | A | 1/1972 | Kreidermacher |
| 3,798,597 | A | 3/1974 | Frambs et al. |
| 3,943,347 | A | 3/1976 | Martinson |
| 4,151,565 | A | 4/1979 | Mazzola |
| 4,215,335 | A | 7/1980 | Doi et al. |
| 4,410,989 | A | 10/1983 | Berlekamp |
| 4,455,629 | A | 6/1984 | Suzuki et al. |
| 4,520,463 | A | 5/1985 | Okumura |
| 4,566,105 | A | 1/1986 | Oisel et al. |
| 4,598,403 | A | 7/1986 | Odaka |
| 4,604,749 | A | 8/1986 | Shinoda et al. |
| 4,763,332 | A | 8/1988 | Glover |
| 4,928,280 | A | 5/1990 | Nielson et al. |
| 4,937,828 | A | 6/1990 | Shih et al. |
| 5,130,991 | A | 7/1992 | Takano |
| 5,267,249 | A | 11/1993 | Dong |
| 5,313,530 | A | 5/1994 | Iwamura |
| 5,325,372 | A | 6/1994 | Ish-Shalom |
| 5,345,451 | A | 9/1994 | Uriu et al. |
| 5,367,544 | A | 11/1994 | Bruekheimer |
| 5,375,127 | A | 12/1994 | Leak et al. |
| 5,408,476 | A | 4/1995 | Kawai et al. |
| 5,671,237 | A | 9/1997 | Zook |
| 5,703,887 | A | 12/1997 | Heegard et al. |
| 5,748,652 | A | 5/1998 | Kim |
| 5,771,249 | A | 6/1998 | Yanagisawa |
| 5,844,923 | A | 12/1998 | Condon |
| 5,867,509 | A * | 2/1999 | Tanaka ........................ 714/758 |
| 5,878,057 | A | 3/1999 | Maa |
| 6,029,186 | A | 2/2000 | DesJardins et al. |

(Continued)

OTHER PUBLICATIONS

Derby, J., "High-Speed CRC Computation Using State-Space Transformations" 2001 GLOBECOM, Nov. 2001, pp. 166-170.

*Primary Examiner*—Stephen M Baker
(74) *Attorney, Agent, or Firm*—Townsend and Townsend and Crew LLP; David B. Raczkowski

(57) ABSTRACT

Circuits and methods provide the concurrent calculation of CRC bits for messages from different channels, where one part of a message is received at a time. Context buffers store certain state variables of the CRC calculation for each channel. The context buffers output data in a synchronized manner with the input data so that the proper calculations are done and the proper data is available at the appropriate times.

22 Claims, 14 Drawing Sheets

U.S. PATENT DOCUMENTS

| | | |
|---|---|---|
| 6,049,903 A | 4/2000 | Nishimura |
| 6,195,780 B1 | 2/2001 | Dravida et al. |
| 6,427,219 B1 | 7/2002 | Yang |
| 6,519,738 B1 | 2/2003 | Derby |
| 6,530,057 B1 | 3/2003 | Kimmitt |
| 6,684,363 B1 | 1/2004 | Cassiday et al. |
| 6,820,232 B2 | 11/2004 | Kim et al. |
| 6,928,608 B2 | 8/2005 | Peyser et al. |
| 6,931,581 B1 | 8/2005 | Cassiday et al. |
| 7,216,285 B2 | 5/2007 | Chen |
| 7,219,293 B2 | 5/2007 | Tsai et al. |
| 7,320,101 B1 | 1/2008 | Bain |
| 2002/0144208 A1 | 10/2002 | Gallezot et al. |
| 2003/0200500 A1 | 10/2003 | Weissinger |

* cited by examiner

METHOD AND APPARATUS FOR CONCURRENT CALCULATION OF CYCLIC REDUNDANCY CHECKS

CROSS-REFERENCES TO RELATED APPLICATIONS

The application is a continuation-in-part of co-owned and co-pending U.S. patent application Ser. No. 10/644,223, titled "FAST PARALLEL CALCULATION OF CYCLIC REDUNDANCY CHECKS," filed Aug. 19, 2003, by Bain, which is hereby incorporated by reference.

BACKGROUND

The present invention is related to error detection in data transmission systems, and particularly to the concurrent calculation of cyclic redundancy checks (CRCs) from different channels or of different messages.

The purpose of error detection systems is to detect whether data messages are corrupted during transmission. If the presence of one or more errors is detected in a received data message, the data message can either be ignored, for example in voice and video applications, a retransmission can be requested, for example in Ethernet and other types of data communication systems, or the error can be corrected, as in forward error correction systems. Being able to detect errors, whether or not the errors are corrected, means that the introduction of errors does not have the same implication as if the errors go undetected, that is, it is not as important to avoid the occurrence of errors if they can be detected. This allows data network systems to be designed such that errors are allowed to occur, typically so long as they occur at or below a known manageable rate. The result is that data can be transmitted at a lower power level and at higher transmission rates. Because of this, data can be transmitted farther and channel capacity can be increased.

Modern data networks transmit data at ever higher data rates, thus received data needs to be processed quickly. Accordingly, the trend in cyclical redundancy checking is to process more bits of data simultaneously. Additionally, modern data networks transmit different messages over the same physical line, where each message may correspond to a different sender or channel. These different messages may be arrive at the CRC circuitry in packets that are interspersed amongst each other. Traditional approaches duplicate the circuitry for different channels, which increases the complexity and cost of the circuitry. Other approaches may drain the circuitry of data for one channel and then restart a computation of another channel, but this is computationally slow.

Therefore, it is desirable to have circuits, methods, and apparatus for rapidly handling interspersed packets from different messages without greatly increasing the complexity of the circuitry required to process them.

SUMMARY

Embodiments of the present invention may be used to calculate CRC bits for messages from different channels, where one part of a message is received at a time. In one aspect, embodiments utilize context buffers for storing certain state variables of the CRC calculation for each channel. The context buffers store and output data in a synchronized manner with the input data so that the proper calculations are done and the proper data is available at the appropriate times.

According to one exemplary embodiment, an integrated circuit includes a CRC circuit, which concurrently calculates CRC bits for messages from different channels. The messages are composed of words sent by the corresponding channel. A feedforward circuit receives the words one at a time and provides a feedforward result for each word to a first summing circuit. A feedback circuit receives a result from the summing circuit and provides a feedback result back to the first summing circuit. The feedback circuit includes a first timing device to facilitate the proper flow of data. The timing device may be a register bank, specifically one having a width equal to a size of the received words.

A first context buffer has an input coupled with the first timing device and an output coupled with the first summing circuit. The first context buffer stores the feedback results for the different channels and outputs a feedback result that is summed with a feedforward result of the same channel as the feedback result. The context buffers can appear right after the respective timing devices or after combinational logic.

In one embodiment, the CRC circuit includes a second timing device that receives a first CRC result from the first summing circuit. A second context buffer has an input coupled with the second timing device and has an output coupled with the first timing device. The second context buffer also stores the first CRC results for the different channels.

In another embodiment, the CRC circuit includes a scaling circuit that is coupled with the first summing circuit and that provides a scaling result to a second summing circuit. The scaling circuit includes a third timing device. A third context buffer has an input coupled with the third timing device and an output coupled with the second summing circuit. The third context buffer stores the scaling results for at least two messages of different channels.

In an embodiment, a context channel signal is coupled with the first context buffer and identifies which feedback result to output from the first context buffer. The context channel signal may be derived from a detection of the channel of a received word during a first clock cycle, and the context channel signal may be received during the first clock cycle. In one aspect, the feedback result is output in the next clock cycle after the first clock cycle.

In another embodiment, an enable signal is coupled with the first context buffer. The enable signal can determine whether data is stored in the first context buffer during a specific clock cycle. When data is stored during a clock cycle, the context channel signal determines where to store the data in a context buffer. In one embodiment, the first context buffer outputs the same data received during a same clock cycle when the context channel signal does not change its value from one clock cycle to a next.

According to one exemplary embodiment, a method computes CRCs for a plurality of messages from a plurality of channels. A plurality of words are serially received interspersed with each other at a feedforward circuit, which calculates a feedforward result that is transmitted to a first summing circuit. A CRC result from the first summing circuit is transmitted to a feedback loop having an output coupled with the first summing circuit and having one or more stages. Each stage has a corresponding feedback state variable. Each of the results are of a specific channel.

During a clock cycle associated with a current channel, each of the feedback state variables of a previous channel are provided to a respective context buffer, and each of the state variables of the current channel are output from one of the respective context buffers. A final feedback state variable of the current channel is summed with a feedforward result of the current channel to form a first CRC. In one aspect, the clock cycle associated with the current channel is one right after a word from that current channel is received.

In one embodiment, the first CRC is transmitted to a second summing circuit. Based on the channel of the first CRC, a scaling state variable of the same channel is output from a scaling context buffer. In another embodiment, a context channel signal is transmitted to the respective context buffers.

The context channel signal carries a channel number value to designate the current channel, and thus which state variable to store and output.

In one embodiment, the state variables of the previous channel are stored in the respective context buffers when the previous channel is different from the current channel. In another embodiment, an enable signal transmitted to the respective context buffers controls whether the state variables of the previous channel are stored. In yet another embodiment, when the previous channel equals the current channel, the output from a respective context buffer is the state variable provided to that respective context buffer during that clock cycle.

According to one exemplary embodiment, an integrated circuit includes a CRC circuit having a feedforward circuit that receives words and provides a feedforward state variable to a first summing circuit. A feedback loop is coupled with the first summing circuit and provides a feedback state variable to the first summing circuit. The feedback loop includes N timing devices and N logic blocks with each logic block producing an Nth state variable. N feedback context buffers are in the feedback loop such that one feedback context buffer is between each of the N timing devices and one feedback context buffer is between the Nth timing device and the first summing circuit. Each of the N feedback context buffers stores state variables for different channels and outputs a state variable for a specific channel based on a channel indicator. N is a positive integer greater than or equal to one.

In one embodiment, the CRC circuit includes a scaling circuit coupled with the first summing circuit and providing a scaling result to a second summing circuit. The scaling circuit includes a second timing device to facilitate the flow of data. A second context buffer has an input coupled with the second timing device and an output coupled with the second summing circuit. The second context buffer also stores the scaling results for the different channels. In another embodiment, the channel indicator includes a context channel signal that is coupled with the N feedback context buffers and that identifies which feedback result to output from each of the N feedback context buffers.

A better understanding of the nature and advantages of the present invention may be gained with reference to the following detailed description and the accompanying drawings.

DETAILED DESCRIPTION OF EXEMPLARY EMBODIMENTS

Embodiments of the present invention may be used to rapidly calculate CRC bits for messages from different channels, where one part of a message is received at a time. In one aspect, embodiments utilize context buffers for storing certain state variables of the CRC calculation for each channel. The context buffers store and output data in a synchronized manner with the input data so that the proper calculations are done and the proper data is available at the appropriate times. Embodiments may be useful for any integrated circuit that needs to calculate CRCs from any number of sources.

Embodiments of the present invention impose no latency on context switch, have a marginal hardware cost (other than 3 bits of memory per checksum bit per channel), and have a small effect on the maximum frequency (Fmax) of the circuit. Embodiments are particularly suited for time division multiplexed communication systems.

I. Detecting Errors with CRCs

Figure 1:
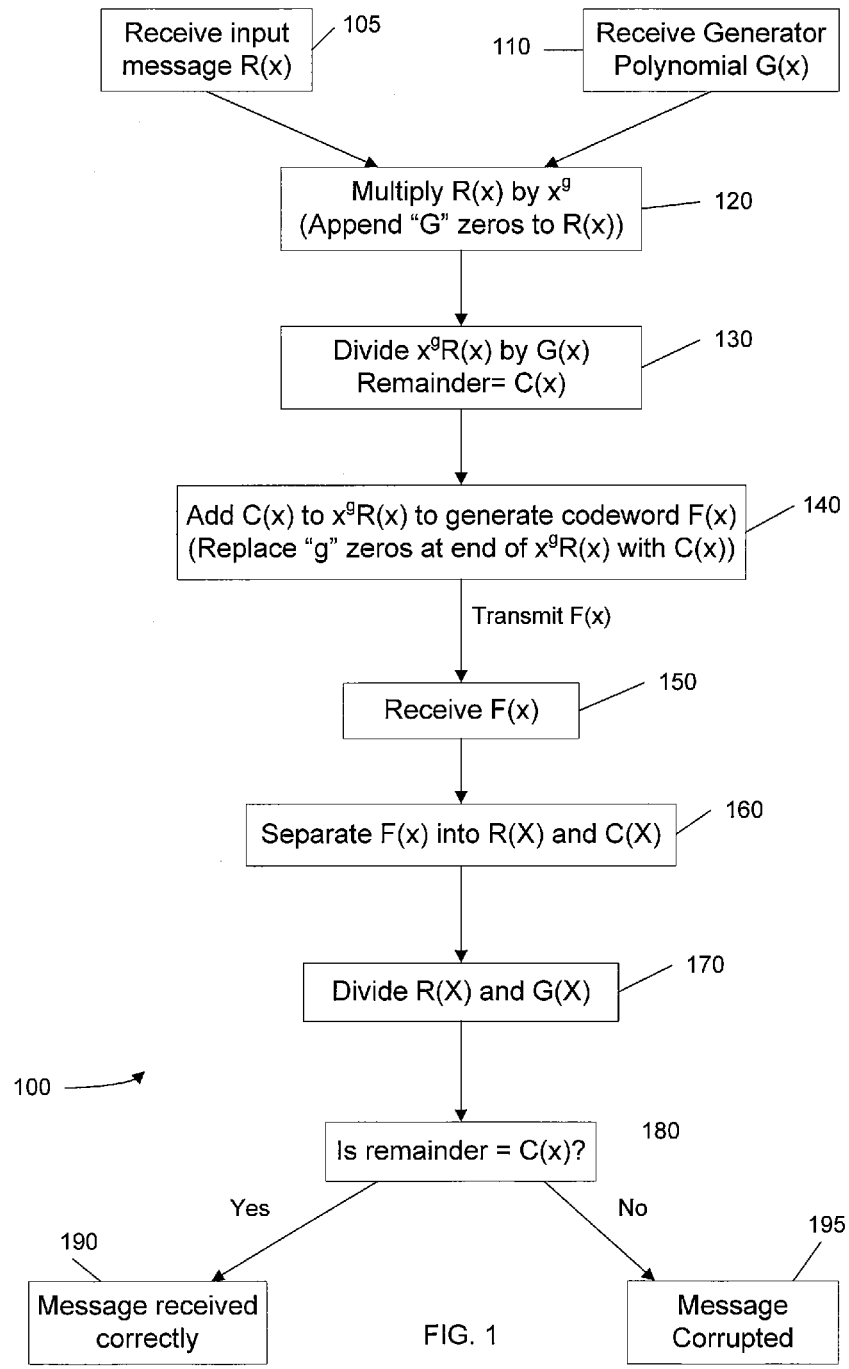
FIG. 1 is a flow chart of a method of transmitting and receiving signals that benefits by incorporation of embodiments of the present invention.

FIG. 1 is a flow chart of a method 100 of transmitting and receiving signals that benefits by incorporation of embodiments of the present invention. This figure, as with all the included figures, is shown for exemplary purposes only and does not limit either the possible embodiments of the present invention or claims.

In act 105, an input message R(x) is received by a CRC circuit. The polynomial R(x) has coefficients that correspond to the data (such as bits, bytes, or words) of the message. This message may be received by a transmitter that is consistent with Ethernet, Hypertransport, Sonet, or other protocol. In act 110, a generator polynomial G(x) is received. This polynomial is typically preselected based on the communications protocol being used. These generator polynomials are designed specifically to increase the detection of various types of errors that may occur.

In act 120, the received message is multiplied by $x^g$, where x is a zero word and g is equal to the order of the generator polynomial G(X). The result of this is that a "g" number of zeros is appended to the received message. In act 130, this product is divided by the generator polynomial, resulting in a quotient which may be ignored, and a remainder or syndrome, which is made up of the CRC bits. In act 140, this syndrome is added to the value determined in act 120 to generate a codeword F(x). In short, the "g" number of zeros that had been appended to the message are replaced by the syndrome C(x). This sum is a codeword F(x) which may be transmitted. In various embodiments of the present invention, other acts, such as interleaving, may be done before the codeword F(x) is sent.

In act 150, the codeword F(x) is received. The codeword F(x) is typically received by a receiver that is separate from the transmitter used to transmit the codeword F(x), and is designed to be compliant with the same protocol as the transmitter.

In act 160, the codeword F(x) is separated into message and remainder portions. In act 170, the message is divided by the same generator polynomial G(X) that the receiver used to generate the remainder. In act 180, it is determined whether the newly calculated remainder is equal to the remainder or syndrome that was transmitted as part of the codeword F(x).

If the newly calculated remainder does not match the received syndrome, it is determined that the message has been corrupted in act 195. In this case, either the message can be ignored, for instance in voice and video transmissions, or a request that data be resent can be made, for instance in data communication systems.

If the newly calculated remainder and C(x) are equal, it is assumed the message was received correctly in act 190. While this is typically true, there is a possibility is that the message has been corrupted in such a way that the remainder calculated by a receiver is the same as the transmitted remainder. In other cases, both the message and the transmitted remainder may be corrupted such that the corrupted message divided by the generator yields the corrupted remainder. In these cases bad data is accepted by the receiver. The likelihood of these occurrences may be reduced with the use of longer generator polynomials.

Figure 2:
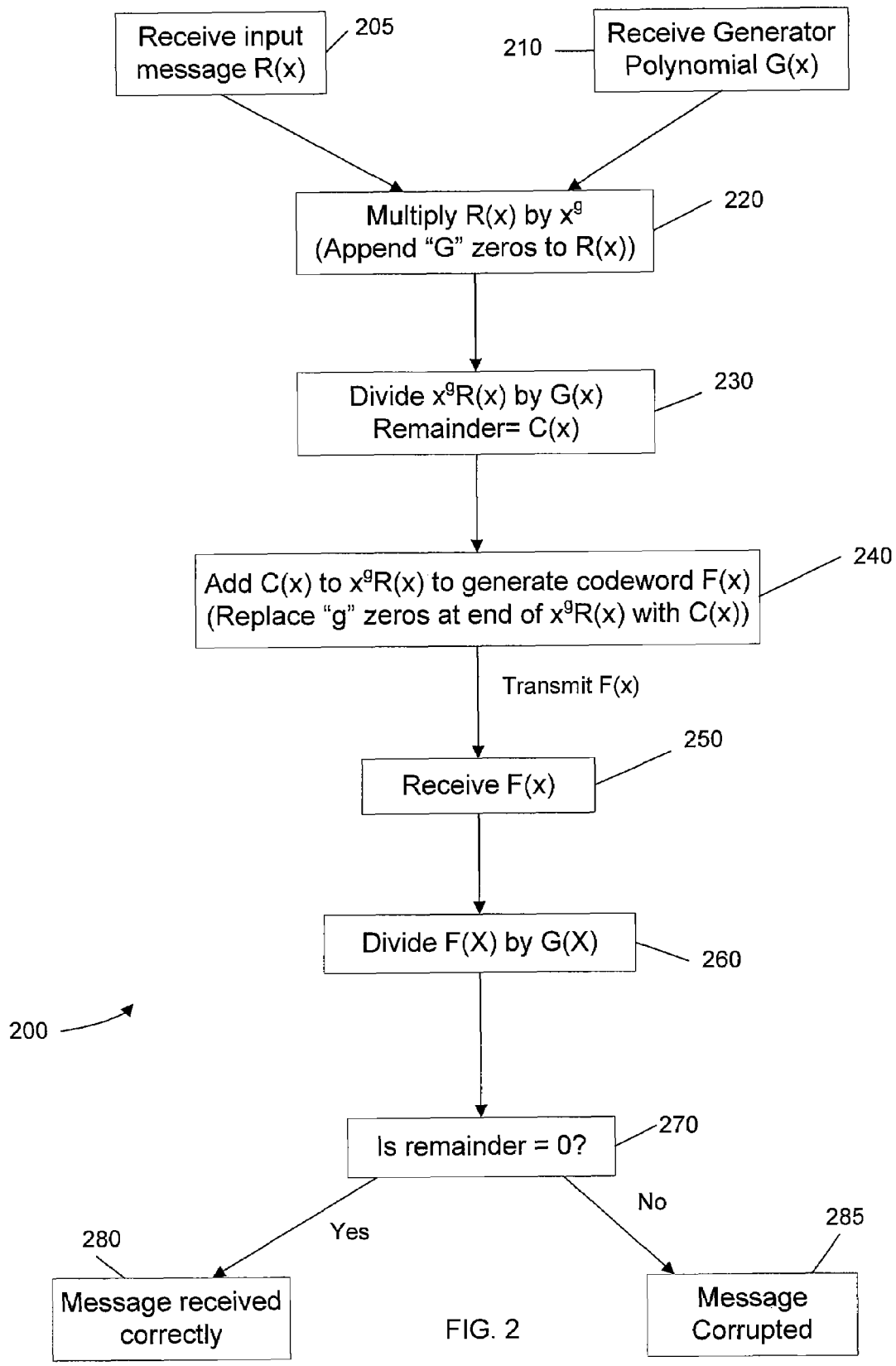
FIG. 2 is another flow chart of a method of transmitting and receiving signals that benefits by incorporation of embodiments of the present invention.

FIG. 2 is another flow chart of a method 200 of transmitting and receiving signals that benefits by incorporation of embodiments of the present invention. In act 205, an input message R(X) is received by a transmitter. Again, this transmitter may be compliant with any one of a number of protocols. In act 210, a generator polynomial G(X) is received. In act 220, the message is multiplied by $x^g$, again this simply means that "g" zeros are appended to the message.

In act 230, the product $x^g R(X)$ is divided by the generator G(X), resulting in a quotient which may be ignored, and a remainder or syndrome C(X). In act 240, the syndrome is added to $x^g R(X)$, thus generating a codeword F(x). In short, this means that the "g" zeros appended to $x^G R(X)$ are replaced with C(X). At this point, further processing such as interleaving may occur, and the codeword F(X) is transmitted.

In act 250, the codeword F(X) is received. In act 260, the codeword F(X) is divided by the generator polynomial G(X) resulting in a quotient, which again may be ignored, and a remainder. In act 270, it is determined whether the remainder is equal to 0. If it is, it may be assumed the message has been received correctly in act 280. If the remainder is nonzero, it is assumed the message is corrupted in act 285. Again, the corrupted message may be ignored or a retransmission may be requested.

Alternately, the syndrome C(X) may be inverted then added to $x^g R(X)$ to generate the codeword F(x). After reception, when F(X) is divided by G(X), the remainder is all ones if there are no errors.

II. Calculating CRCs

Figure 3:
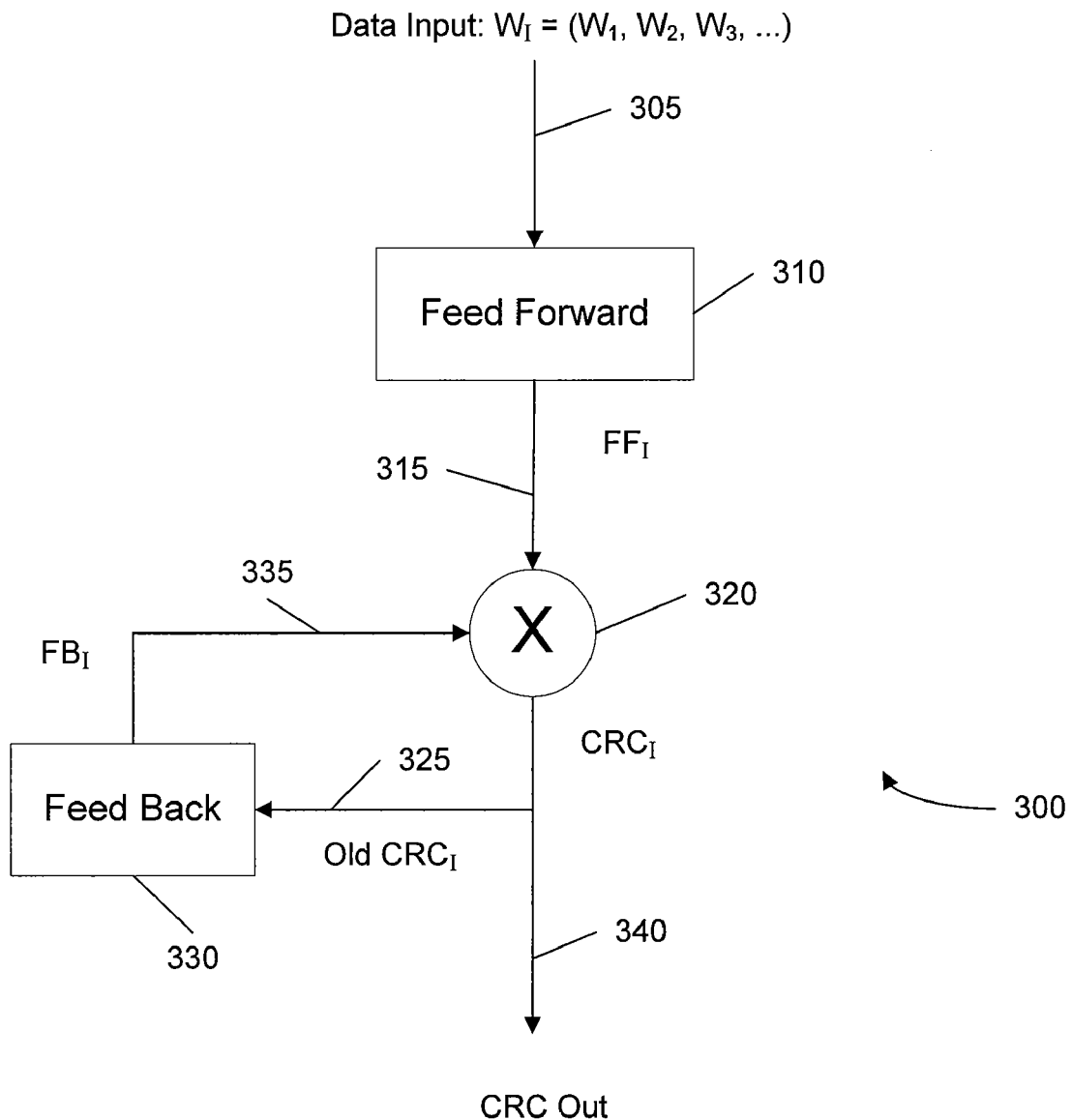
FIG. 3 is a circuit that may be used by a receiver or transmitter for calculating a CRC for an input message.

A computationally intensive part of the transmitting and receiving signals is the calculation of the remainder, which is the CRC bits. FIG. 3 is a circuit 300 that may be used by a receiver or transmitter for calculating a CRC for an input message. For example, the circuitry of FIG. 3 may be used to implement a CRC circuit according to the methods shown in FIG. 1 or 2. Included are feedforward circuit 310, summing circuit 320, and feedback circuit 330.

The forward circuit 310 receives data input bits or words $W_1$ {$W_1, W_2, W_3, \ldots$} on line 305 and provides an output feedforward ($FF_1$) to the summing circuit 320. Feedback circuit 330 receives the current CRC (oldCRC$_1$) on line 325 and provides an output $FB_1$ on line 335 to the summing circuit 320. In this way, the CRC output on line 340 may be calculated from the data input on line 305.

Figure 4:
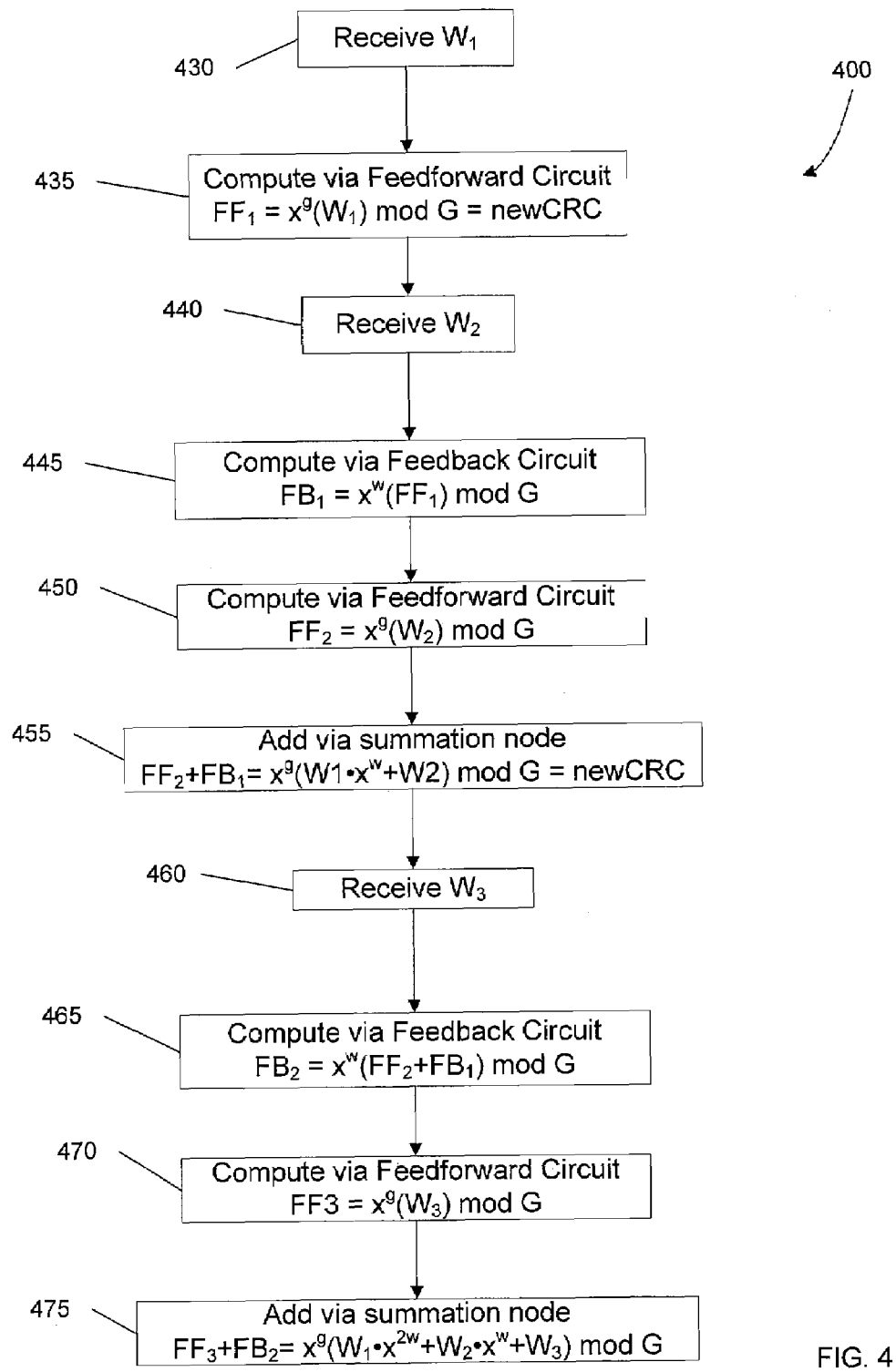
FIG. 4 is a flow chart of a method of computing CRCs that may incorporate feedforward and feedback elements of embodiments of the present invention.

FIG. 4 is a flow chart of a method of computing CRCs using circuit 300. The CRC circuit 300 receives the input words $W_1$, $W_2$, and $W_3$ of a message at its data input, and provides CRC bits as an output. The following method may be used by the CRC circuit 300 to determine the remainder of methods 100 or 200, where the remainder is used as the CRC bits. $W_1$, $W_2$, and $W_3$ are received words of a message, where each have a length "w" and correspond to a different coefficient of the polynomial R(x). G(X) is the generator polynomial having a length "g."

In act 430, the first data word W1 is received. In act 435, $x^g W_1$ is divided by G(X) in feedforward circuit 310 to give $FF_1$. This remainder is the CRC if no additional data words are received. However, in act 440, a new data word $W_2$ is received. Accordingly, in act 445, $FB_1$ is computed by feedback circuit 330, where $FB_1 = x^w(FF_1) \bmod G$. In act 450, $FF_2$ is computed, where $FF_2 = x^g(W_2) \bmod G$. $FF_2$ and $FB_1$ are summed, resulting in a new CRC, in act 455. This is the CRC value if no further data words in this message are received by the CRC circuit 420. Again, however, in act 460, a new data word $W_3$ is received. Accordingly, $FB_2$ is computed in act 465, where $FB_2 = x^w(FF_2 + FB_1) \bmod G$. In act 470, $FF_3$ is computed, where $FF_3 = x^g(W_3) \bmod G$. $FF_3$ and $FB_2$ are summed, resulting in a new CRC value in act 475. Again, if no new data words are received, this is the CRC for the received message.

The timing constraints for circuit 300 are fairly severe. The feedforward path may be arbitrarily pipelined, at least to the extent that CRC values are required by other transmitting or receiving circuitry. However, the feedback path must complete its operation in one clock cycle, such that a feedback term is available for the corresponding CRC feedforward terms on line 315. Accordingly, in order to ease and mitigate these timing constraints, embodiments of the present invention pipeline the feedback stage such that the feedback path has two or more clock cycles in which to complete its operation.

Figure 5:
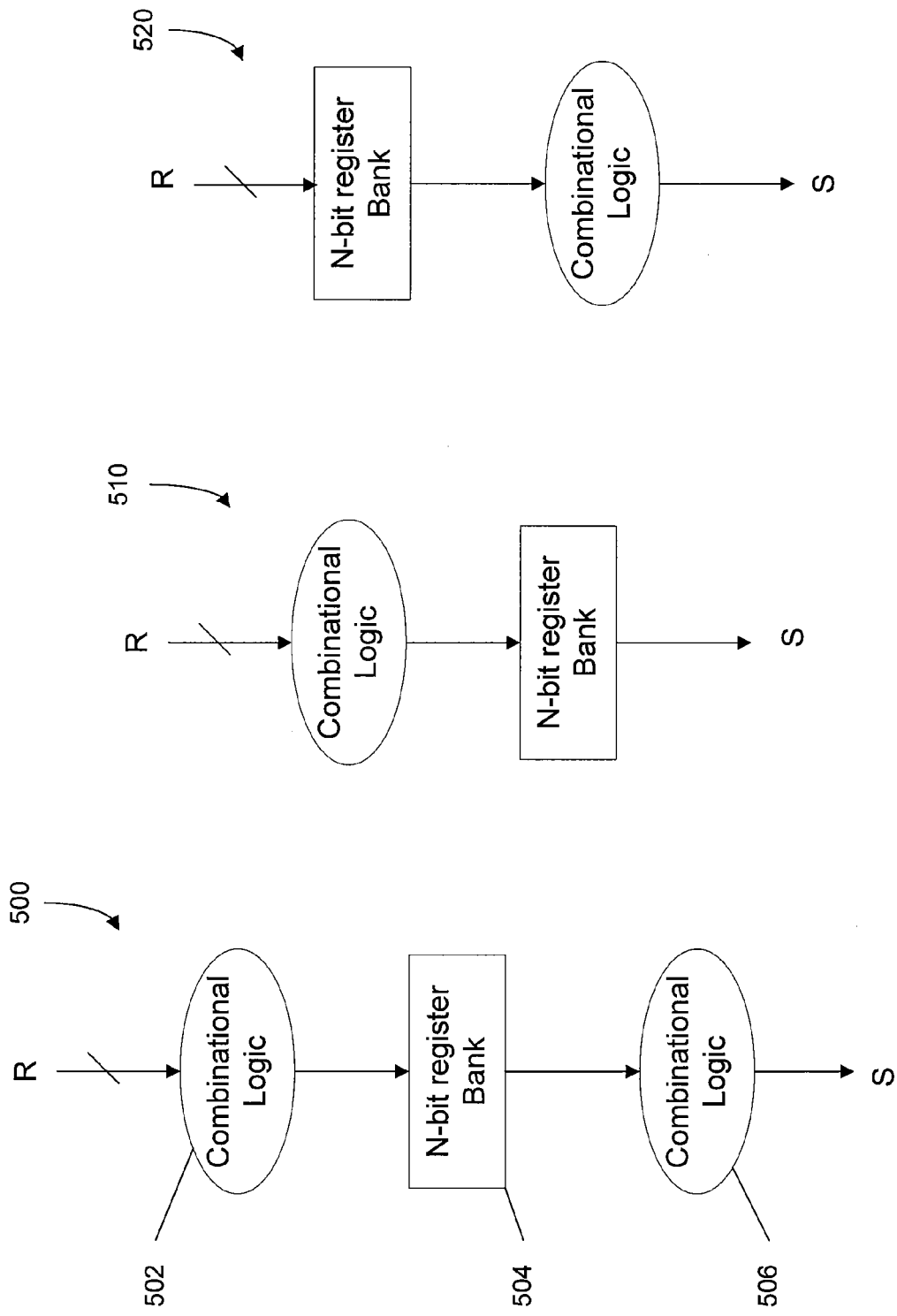
FIG. 5 illustrates a variety or architectures that may be used to implement a feedforward and feedback circuits consistent with an embodiment of the present invention.

FIG. 5 illustrates a variety or architectures that may be used to implement a feedforward and feedback circuits consistent with an embodiment of the present invention. Similar architectures can be used in the feedback path as well. In example 500, an input is received by a first combinatorial logic group of circuits 502. This logic 502 may implement the expressions used in various input terms, as detailed in U.S. patent application Ser. No. 10/644,223, incorporated by reference above. These expressions may be stored in a group of memory 504 (such as n-bit register banks, flip-flops, or any other suitable timing circuit) and combined in the second combinatorial logic group 506, resulting in the feedforward terms. In example 510, the two levels of logic are combined in one logic group, the outputs of which are then stored in the registers. In example 520, the inputs are stored, then fed to logic circuits. The architecture chosen at least partly depends on the timing delays of surrounding circuitry and the required delay times for these circuits.

Figure 6:
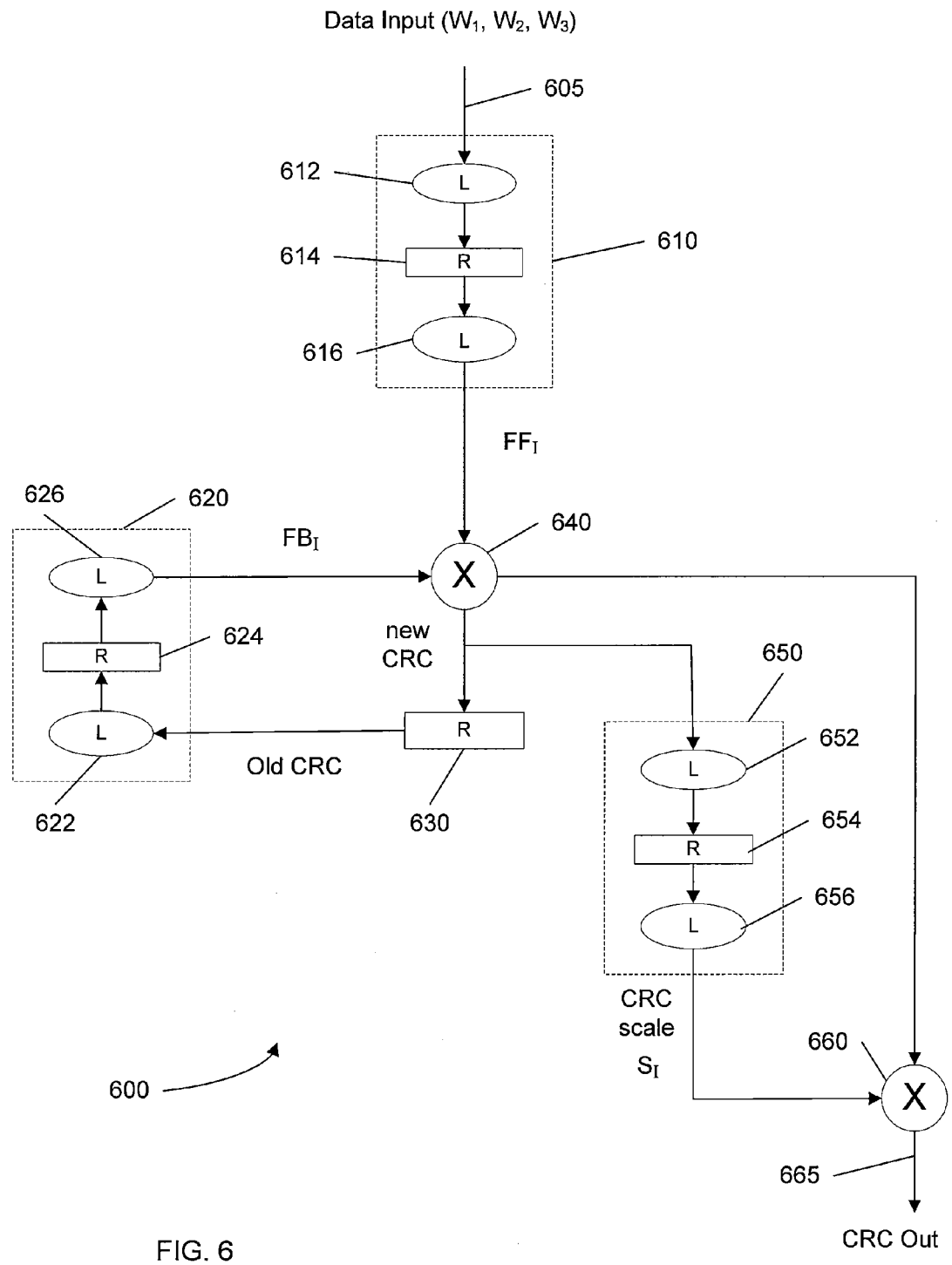
FIG. 6 is a block diagram of a circuit that may be used by a receiver or transmitter for calculating a CRC for an input message in accordance with embodiments of the present invention.

FIG. 6 is a block diagram of a circuit 600 that may be used by a receiver or transmitter for calculating a CRC for an input message in accordance with embodiments of the present invention. Included are feedforward circuit 610, feedback circuit 620, summing circuit 640, delay circuit 630, scaling circuit 650, and output summing circuit 660. In one embodiment, delay circuit 630 is a register bank that has a width that is the size of the words. Data is received on line 605, and CRC output values are provided by the output summing circuit 660 on line 665.

As depicted, feedforward circuit 610, feedback circuit 620, and scaling circuit 650 perform logic operations during different clock cycles, such that the feedforward and feedback paths are pipelined. The effect of pipelining the feedback path is to create a two-cycle feedback path instead of the usual single-cycle path. This means that the CRC circuit is actually computing two interleaved CRCs: one for the odd words and one for the even words. For instance, the combinational logic 622 acts during one clock cycle to provide a result stored in register 624, and combinational logic 624 acts on that result on the next clock cycle. In one aspect, the timing constraints of the feedback path are alleviated. The scaling circuit 650 adjusts second-to-last CRC value to account for the fact that there is only one word to follow.

Figure 7:
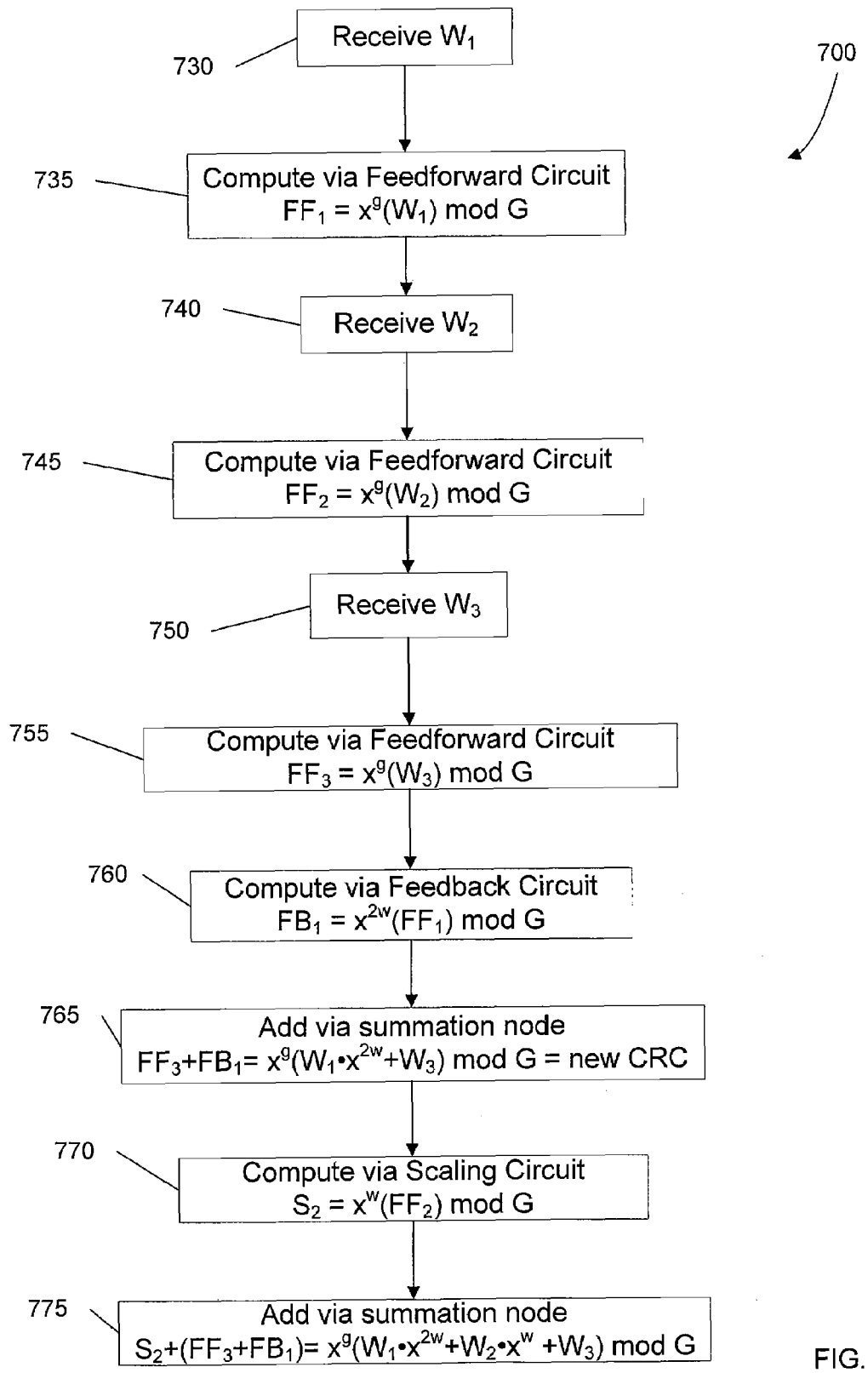
FIG. 7 is a flow chart of a method of calculating CRCs that is consistent with an embodiment of the present invention.

FIG. 7 is a flow chart of a method of calculating CRCs that is consistent with an embodiment of the present invention. As before, data is received by CRC circuit 600, and CRC output values provided. Data words are received in sequence $W_1$, $W_2$, and $W_3$. Accordingly, the remainder is computed.

In act 730, W1 is received by the CRC circuit 600. Accordingly, in act 735, $FF_1$ is computed where $FF_1=x^g(W_1) \bmod G$. In the embodiment of circuit 600, part of this calculation happens in the first clock cycle via combinational logic 612, and the other part in combinational logic 616 during a second clock cycle. A register bank 614 that is at least as wide as the input data words provides storage in between clock cycles. If no further data words are received, S1 is the CRC for the received message.

In act 740, $W_2$ is received by the CRC circuit 600, which occurs during the second clock cycle. Accordingly, $FF_2$ is computed where $FF_2=x^g(W_2) \bmod G$, which can occur in the 2nd and 3rd clock cycles. During the 2nd clock cycle, register 630 receives $FF_1$ and transmits $FF_1$ on the 3rd clock cycle. The feedback term is not required yet at summing circuit 640, thus the CRC circuit may take an additional clock cycle in which to compute it.

In act 750 during the 3rd cycle, $W_3$ is received by the CRC circuit 600. Accordingly, $FF_3$ is computed in act 755 where $FF_3=x^g(W_3) \bmod G$, which can occur in the 3rd and 4th clock cycles. At this time, the feedback term $FB_1$ is needed and its computation is completed in act 760, where $FB_1=x^{2w}(FF_1) \bmod G$. During the 3rd clock cycle, computational logic 622 calculates part of $FB_1$, and computational logic 626 upon receiving the result from register 624 calculates the other part during the 4th clock cycle. Also during the 4th clock cycle, in act 765, $FB_1$ and $FF_3$ are summed. In act 770, $S_2$ is computed via the scaling circuit 650, where $S_2=x^w(FF_2) \bmod G$, which occurs during the 3rd and 4th clock cycles. In act 1175, $S_2$ is summed with $(FB_1+FF_3)$, resulting in the CRC value on line 665, which also occurs during the 4th clock cycle.

III. Messages from Multiple Channels

In the above example, the words $W_1$-$W_3$ of a message were received sequentially by the CRC circuit. However, in some systems, a communication system shares data among multiple channels on a single physical data line. The communication system sends or receives messages concurrently for a plurality of channels, which results in parts of messages from a channels being interspersed with other messages of other channels. For each of the messages from different channels, the communications system performs error control calculations, such as for a cyclic redundancy check code. This situation has led to the duplication of circuitry or slow calculations of the CRCs for the messages.

Figure 8:
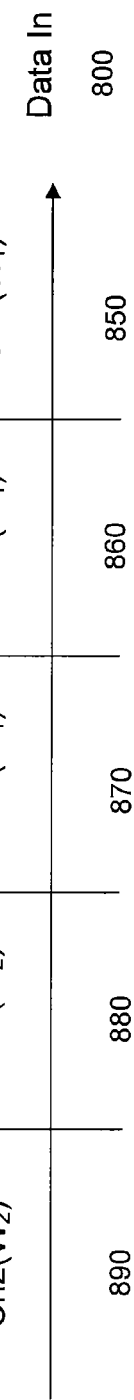
FIG. 8 shows messages that are each from a different channel and an interleaved data stream of three channels.

FIG. 8 shows messages 810-830 that are each from a different channel and an interleaved data stream of three channels. Each message is composed of separate words, which indicate the channel from which it originated. The input data stream 800 shows the messages of the three channels sharing the same physical input line. This data stream is used to check the integrity of the messages. As one can see, the words for the messages are interleaved or interspersed amongst each other. This is due in part to the high speed of modern communication systems. To keep the throughput as high as possible, the words are sent when available, thus causing interleaving. Note that the interleaving may occur in any order with some words of the same channel possibly appearing sequentially. As the messages are coming at a high speed, a high speed CRC formulation that can take care of interleaved data is needed.

Traditional approaches to calculating multiple CRCs concurrently involve replicating the circuit so that each of a multiple copies of circuits handles the messages from a particular channel. Another approach uses one circuit, but has the detriment of being relatively slow. Upon receiving a word from a different channel, the circuit would need to complete calculation of the CRC to a given point, and then start or resume calculation on the new channel. This involves waiting multiple cycles to drain the results of one channel's packet and then start loading data for the next channel. For instance in circuit 600, the pipeline stages would need to be refilled. This process takes additional time to replicate such information and thus wastes valuable computing time.

IV. Concurrent Calculation of Multiple Channels

The present invention allows the interleaved computation of multiple CRCs with one circuit in an efficient manner. This is accomplished by saving key state variables within certain regions of the circuit so that when calculating a CRC of a given channel the data is available. When channels are switched, the data for the new channel is restored into the calculation stream at the proper points and times.

Embodiments allow different parts of the CRC circuit to process data from different channels simultaneously by using context buffers to make context switches. In some embodiments, there is one context buffer after each register whose output is combined with newer data. In one embodiment, the key state variables in the design are identified as the two stages of the feedback calculation and the second stage of the CRC scaling block. These state variables are stored in context buffers inserted inline. With a one cycle advance notice of the new channel, the context buffers either pass through their input data or supply the last stored state variable for that channel, depending on whether the new channel is the same or differs from the current.

Figure 9:
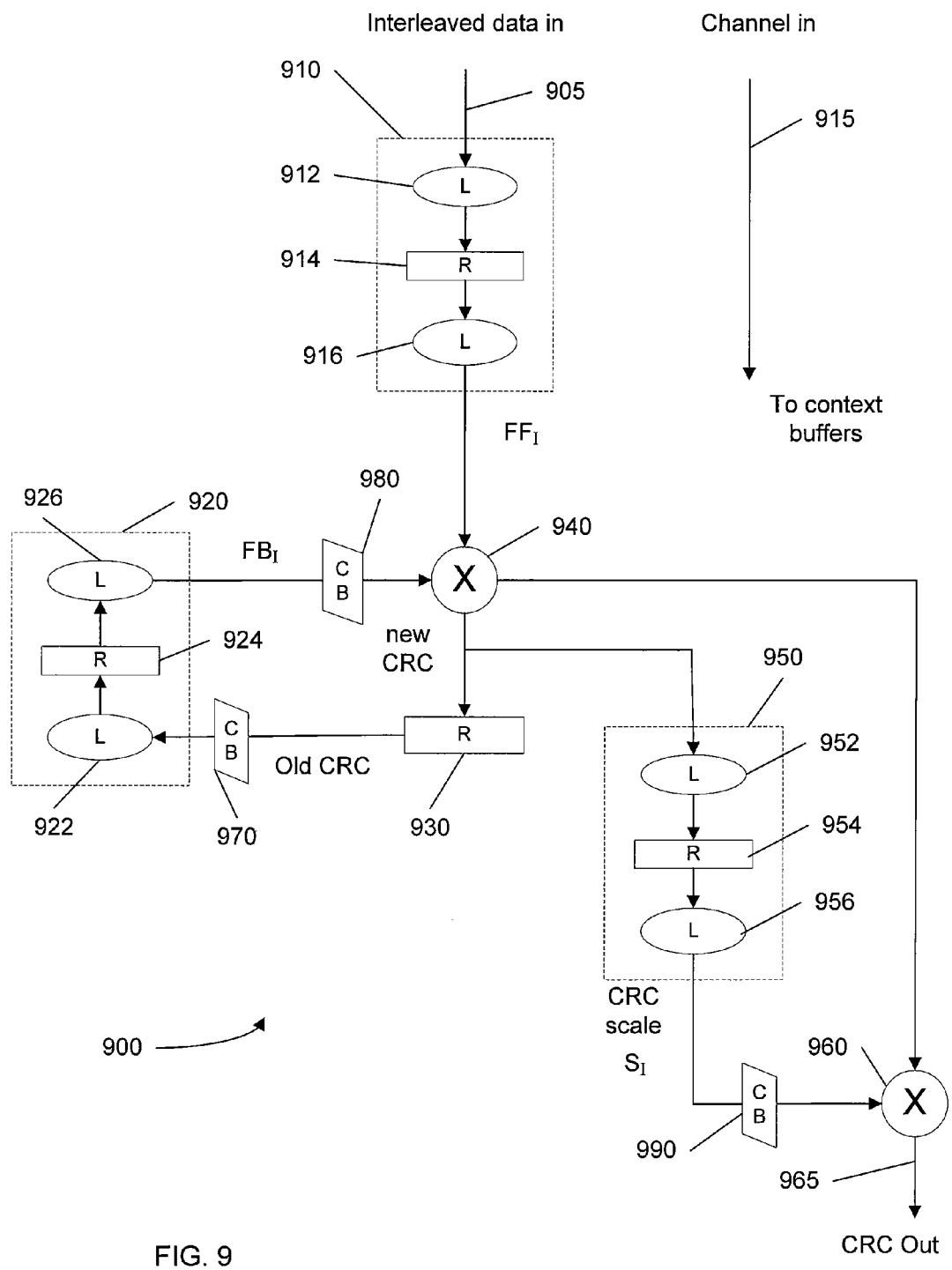
FIG. 9 is a block diagram of a circuit usable to concurrently calculate CRCs of messages from multiple channels according to an embodiment of the present invention.

FIG. 9 is a block diagram of a circuit 900 usable to concurrently calculate CRCs of messages from multiple channels according to an embodiment of the present invention. Circuit 900 mirrors circuit 600 in the calculation of a CRC for a single channel; however, circuit 900 can handle calculating CRCs for messages from multiple channels. Circuit 900 includes context buffers 970-990 for storing state variables of different channels. The state variables are: (1) the "oldcrc" value (2) the "feedback" value $FB_1$, and (3) the "scaled" value $S_1$. Context buffer 970 stores the "oldcrc" values for each channel. Context buffer 980 stores the "feedback" values for each channel. Context buffer 980 stores the "scaled" values for each channel. Context buffers 970 and 980 may be referred to as feedback context buffers as they occur in the feedback loop, while context buffer 980 may be referred to as a scaling context buffer.

In one embodiment, the context buffers contain a two-port memory and receive a context channel signal 915, which provides the channel number, and an associated enable signal, as well as the data value of the state variable. For each context buffer, the context channel signal is sent to the context buffers. Upon receiving a specific context signal, the context buffer prepares the data for that channel to be conveyed, for example, during the next clock cycle. This next clock cycle would then be associated with that channel that is conveyed from the context buffer.

In an embodiment, there is a one cycle delay to read the data from the memory because the memory is synchronous. Thus, in this embodiment, the context buffers require a context channel signal and the associated enable signal one clock in advance of the data. The remainder of the circuit can use an enable signal which is coincident with the data. In another embodiment, the context buffers output the state variables in the order received and assume exact interleaving. Thus, no context channel signal may be required, but only an internal indicator (e.g. a counter) of which channel's data to output.

If the channel signal received is the same as the previous channel signal (the current data being sent out), then the context buffer lets the data received in that clock cycle pass right through. In one embodiment, context buffers compare the write pointer (i.e. which channel to write the state to) and the read pointer (i.e. which channel to read the state from) delayed by one clock cycle. If they are the same, then there is no context switch. Thus, as no context switch has occurred, the context buffer data output is the data input. In this case the context buffer behaves as a wire. If the channel signals are different, then the data received during that clock signal is stored and the data for the different channel is read from memory and sent out.

If there is no data received during a clock cycle, then the associated state variables received into the context buffers (e.g., received during the next clock cycle) should not be stored as the data is not valid. In such an instance, an enable signal controls the context buffers not to store that data and to disregard the channel signal. In instances where a state variable is to be output but no state variable has been received, the context buffers may be initialized with the appropriate values, such as all zeros or all ones. For example, at the end of a message, as indicated by start/end of message signals, the context buffers are initialized with the appropriate data. In the case of CB970, this initial value (e.g. zeros) then propagates, after the first word of a message from that same channel is received, to CB 980 where it may be output to be summed with the feedforward result of the first word. In the case of CB 990, the output is required only at the end of the message, thus the leftover data from the previous message can get flushed by the data from the new word.

Note that if larger pipelines were used for the feedforward and feedback circuits then embodiments would contain more context buffers would be required. There would be one context buffer between each register of the feedback circuit, e.g., N context buffers for an N stage feedback loop. Embodiments would also have more scaling circuits, which would have similar placement of context buffers of the new feedback circuits. Additionally, if smaller pipelines were used, then only one context buffer is required. For example, in circuit 300, only one context buffer is required between feedback circuit 330 and summing circuit 320. In one aspect, this is because there is only one register in the feedback loop.

Figure 10:
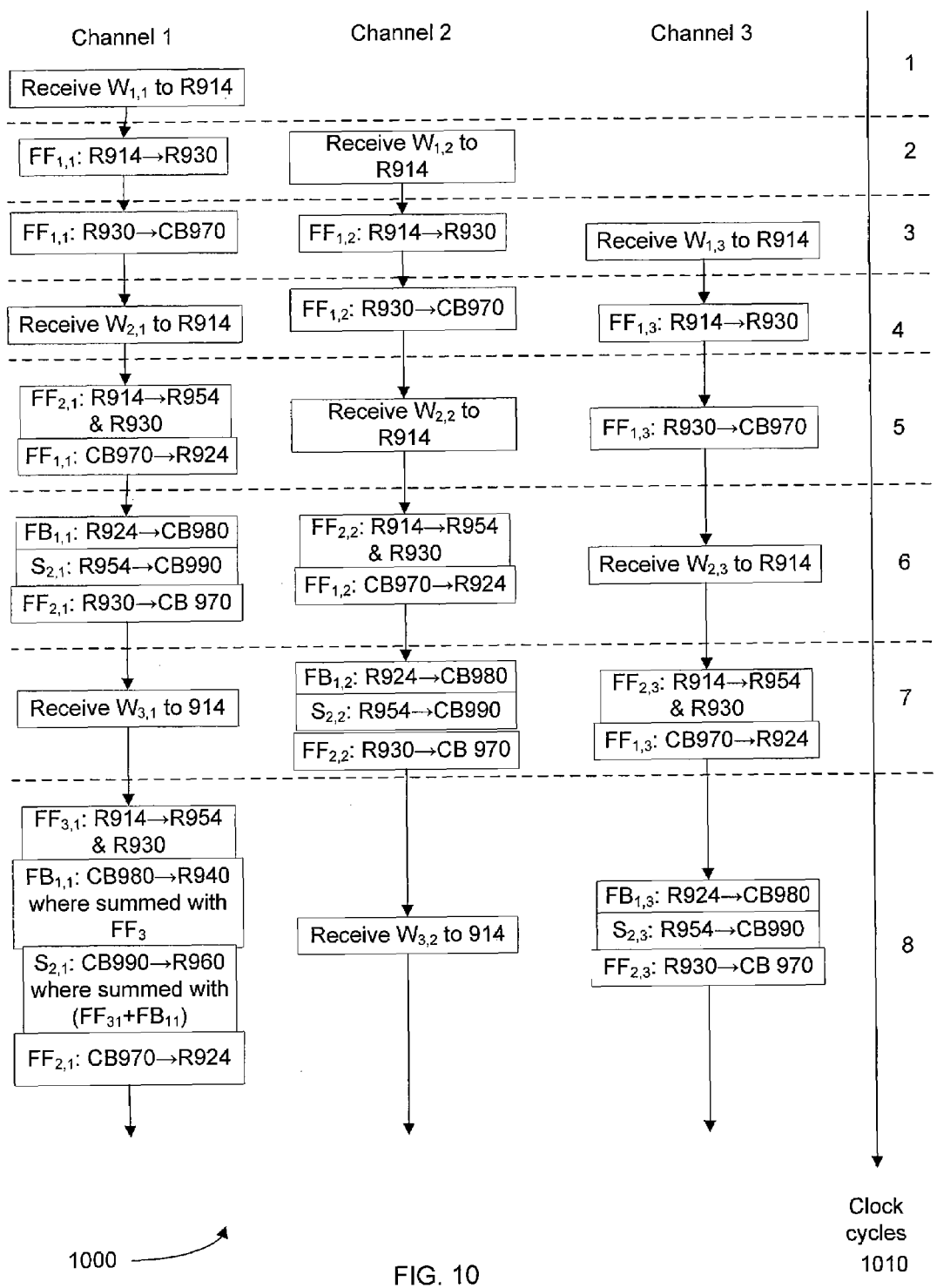
FIG. 10 is a timing diagram that shows the flow of data through the circuit of FIG. 9 according to an embodiment of the present invention.

FIG. 10 is a timing diagram 1000 that shows the flow of data through circuit 900 according to an embodiment of the present invention. The right hand side shows an increasing numbering of clock signals 1010. In timing diagram 1000, the clock cycles occur at the beginning of receiving an input data stream. The columns channel1-channel3 signify the different data from each channel. Timing diagram 1000 shows what is occurring in the circuit for each channel during a particular clock cycle.

In the 1st clock cycle, the first word $W_{1,1}$ of channel 1 is received and results from logic 912 are stored at register 914 (R914). In the 2nd clock cycle, the feedforward result (FF$_{1,1}$) for word 1 of channel 1 is sent from R914 to register 930 (R930). Note that a summation does not occur at summing circuit 940 since $W_{1,1}$ is the first word received. In one embodiment, only zeros are output from context buffer 980, which may be the result of a clear signal. If there had been a summation then FF$_{1,1}$ would have been transformed to a new CRC. While this transfer occurs, the first word $W_{1,2}$ of channel 2 is received and results from logic 912 are stored at R914.

In the 3rd clock cycle, FF$_{1,1}$ is sent from R930 to context buffer 970 (CB970). Since the data in clock cycles 1 and 2 were from different channels, FF$_{1,1}$ is stored in CB970. At this point FF$_{1,1}$ is termed the old CRC. Also in the 3rd clock cycle, the feedforward result (FF$_{1,2}$) for word 1 of channel 2 is sent from R914 to register 930 (R930). Also, the first word $W_{1,3}$ from channel 3 is received and results from logic 912 stored at register 914 (R914). As one can see, the steps for channel 2 and channel 3 are simply one clock behind that of channel 1. This is because the data stream 800 alternates between the channels. As such, only the timing of channel 1 will be discussed from this point forward. If the data stream did not alternate in that order, then the timing diagram could differ.

In the 4th clock cycle, the second word $W_{2,1}$ of channel 1 is received. Note that the state variable "old CRC" for channel 1 in CB970 is not sent during this clock cycle as data from channel 3 had been received in the prior clock cycle. In the 5th clock cycle, the feedforward result (FF$_{2,1}$) for word 2 of channel 1 is sent from R914 to R930 and to scaling circuit 950, where a result of logic 952 is stored in R954. Since the prior clock cycle received data from the 1st channel, the state variables for channel 1 are sent out from the context buffers. Since CB980 has not received any data yet, no result or only all zeros are summed at summing circuit 940 with FF$_{2,1}$. CB970 has received data so the state variable (old CRC), which equals FF$_{1,1}$ here, is sent from CB970 and a result of logic 922 is stored in R924.

In the 6th clock cycle, the feedback result FB$_{1,1}$ for word 1 of channel 1 is automatically sent to CB 980, which stores it since the data received in the last clock cycle was from channel 2 and not channel 1. The result $S_{2,1}$ of the scaling circuit 950 is sent from R954 to CB990, where it is stored. FF$_{2,1}$ is also sent from R930 to CB970 where it is stored. In one embodiment, the context buffers have a read address that is one cycle advanced from the write address. This can be seen by the output of the old CRC for channel 1 in the $5^{th}$ clock cycle and a write of FB$_{1,1}$ in the $6^{th}$ clock cycle. In the 7th clock cycle, the third word $W_{3,1}$ for channel 1 is received.

In the 8th clock cycle, the feedforward result (FF$_{3,1}$) for word 3 of channel 2 is sent from R914 to summing circuit 940. The state variables are sent from the context buffers since channel 1 data was received on the last clock cycle. FB$_{1,1}$ is sent from CB980 to summing circuit 940 where it is combined with FF$_{3,1}$. Also, $S_{21}$ is sent from CB990 to summing circuit 960 where it is combined with the sum of FB$_{1,1}$ and FF$_{3,1}$.

In one aspect, the state variables of the feedback loop, such as the FB result and the old CRC, are calculated based on the feedforward result. Thus, for a single feed forward result, there are N state variables calculated in different clock cycles in a feedback loop with N stages. Additionally, for N feedforward results for the same message and channel, there are up to N calculated state variables in the feedback loop at any one time.

Figure 11:
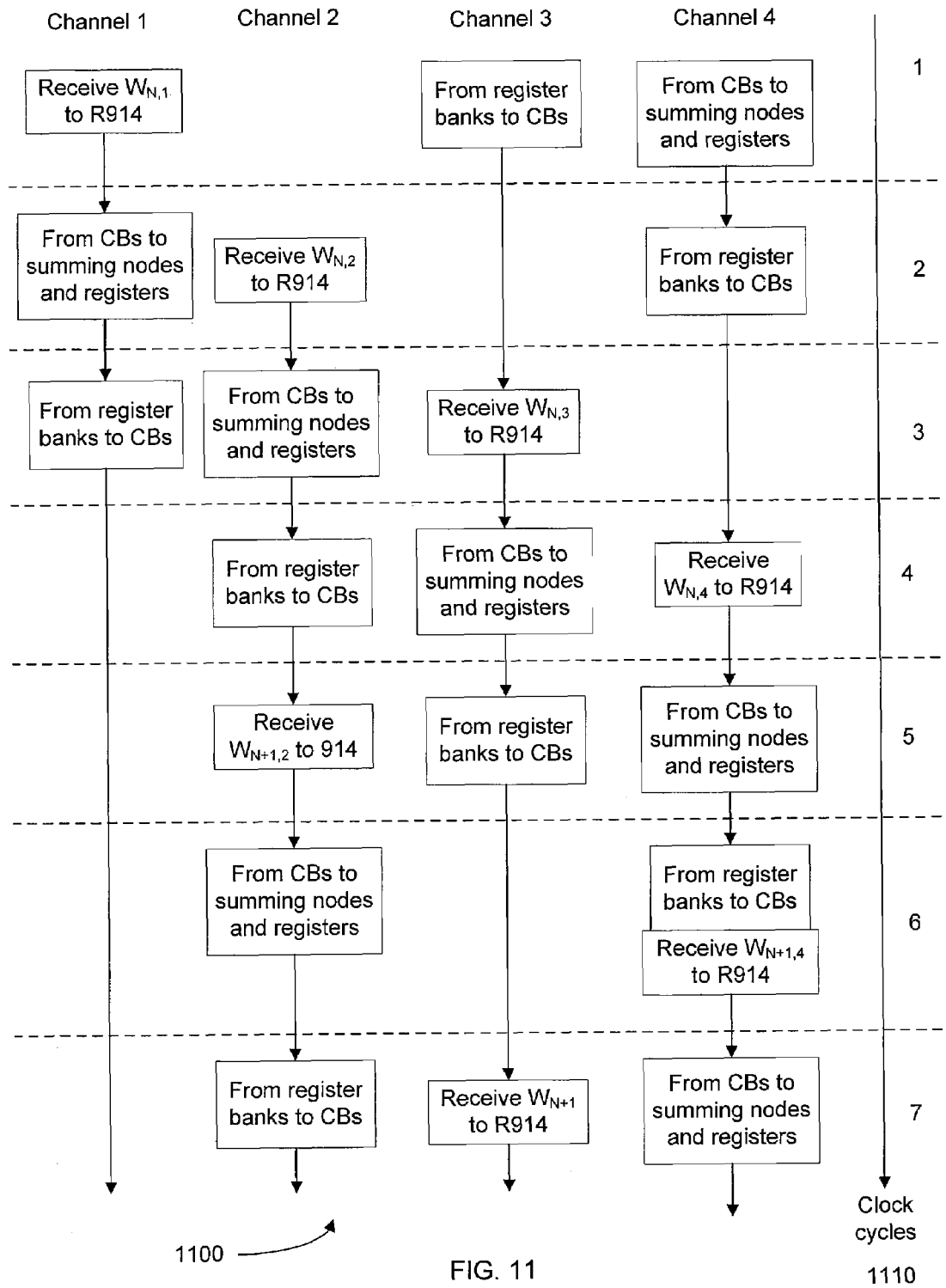
FIG. 11 illustrates a timing diagram for a circuit receiving data from four channels according to an embodiment of the present invention.

In this manner, the feedback data and the scaling data are combined with the feedforward data at the proper time. Also, the different parts of the circuit do not have to wait for more data for a particular channel to be received as other data for a different channel may be processed instead. One can also see that for 3 channels and an alternating data stream, some data for every channel is being processed somewhere in the circuit during anyone clock cycle. In some embodiments, this is not true for more channels. In some embodiments processing data from more than three channels, as long as data is continuously received, the different parts of the circuit 900 will be processing data. This can be further seen in another timing diagram where four channels are accommodated FIG. 11 illustrates a timing diagram 1100 for a circuit receiving data from four channels according to an embodiment of the present invention. Note that embodiments may accommodate any number of channels. The columns (channel 1-channel 4) signify the different data from each channel. Timing diagram 1100 shows what is occurring in the circuit for each channel during a particular clock cycle. Timing diagram 1100 assumes that sufficient words for each channel have been received prior to clock cycle 1 to fill up the context buffers with the respective state variables. The input data stream is . . . , ch3($W_{N-1}$), ch4($W_{N-1}$), ch1($W_N$), ch2($W_N$), ch3($W_N$), ch4($W_N$), ch2($W_{N+1}$), ch4($W_{N+1}$), ch3 ($W_{N+1}$), . . . .

In the 1st clock cycle, the Nth word $W_{N,1}$ for channel 1 is received and a result stored in register 914. The state variables for channels 3 and 4 are being processed in accordance with words for those channels having been previously received. The contents of these steps will become readily seen based on the following discussion.

In the 2nd clock cycle, the feedforward result $FF_{N,1}$ for the Nth word of channel 1 is calculated. The state variables in the context buffers (CBs) are output for channel 1 since a word for channel 1 was received in the last clock cycle. For instance, CB 980 outputs a feedback result $FB_{N-2,1}$, which is combined with $FF_{N,1}$ at summing circuit 940 to form a new CRC for even terms. This new CRC is stored in register 930. CB 990 outputs the scaled check byte $S_{N-1,1}$ to summing circuit 960, which sums $S_{N-1,1}$ with ($FB_{N-2,1}+FF_{N,1}$) to form an output CRC. The old CRC is output from CB 970 to the feedback circuit, where a result is stored in register 924. Note that this is the same step that occurs for channels 4 in the 1st clock cycle. Also, during this clock cycle, the Nth word $W_{N,2}$ for channel 2 is received and a result stored in register 914.

In the 3rd clock cycle, resultant data for channel 1 is sent from registers (930, 924, 954) to respective context buffers (970, 980, 990). Note that this step was performed for channel 4 in the 2nd clock cycle and for channel 3 in the 1st clock cycle. For channel 2, state variables are output from the context buffers to summing circuits and registers, since a word for channel 2 was received in the last clock cycle. Also, during this clock cycle, the Nth word $W_{N,3}$ for channel 3 is received and a result stored in register 914. Also, note that no data for channel 4 is being processed during this clock cycle since it has been more than two clock cycles since a word for channel 4 was received.

In the 4th clock cycle, resultant data for channel 2 is sent from registers (930, 924, 954) to respective context buffers (970, 980, 990). For channel 3, state variables are output from the context buffers to summing circuits and registers since a word for channel 3 was received in the last clock cycle. Also, the Nth word $W_{N,4}$ for channel 4 is received and a result stored in register 914. Note that no data is processed for channel 1 as it has been more than two clock cycles since a word for that channel has been received.

In the 5th clock cycle, the N+1th word $W_{N+1,2}$ for channel 2 is received and a result stored in register 914. For channel 3, resultant data for channel 3 is sent from registers (930, 924, 954) to respective context buffers (970, 980, 990). For channel 4, state variables are output from the context buffers to summing circuits and registers since a word for channel 4 was received in the last clock cycle.

In the 6th clock cycle, state variables for channel 2 are output from the context buffers to summing circuits and registers since a word for channel 2 was received in the last clock cycle. For channel 3, no data was processed since it has been more than two clock cycles since a word for that channel has been received. For channel 4, resultant data for channel 4 is sent from registers (930, 924, 954) to respective context buffers (970, 980, 990). Also for channel 4, the N+1th word $W_{N+1,4}$ for channel 4 is received and a result stored in register 914. Thus, two different processes regarding channel 4 are done during this clock cycle.

In the 7th clock cycle, for channel 2, resultant data for channel 2 is sent from registers (930, 924, 954) to respective context buffers (970, 980, 990). Also, the N+1th word $W_{N+1,3}$ for channel 3 is received and a result stored in register 914. For channel 4, state variables are output from the context buffers to summing circuits and registers since a word for channel 4 was received in the last clock cycle. The process will then continue for other clock cycles.

Figure 12:
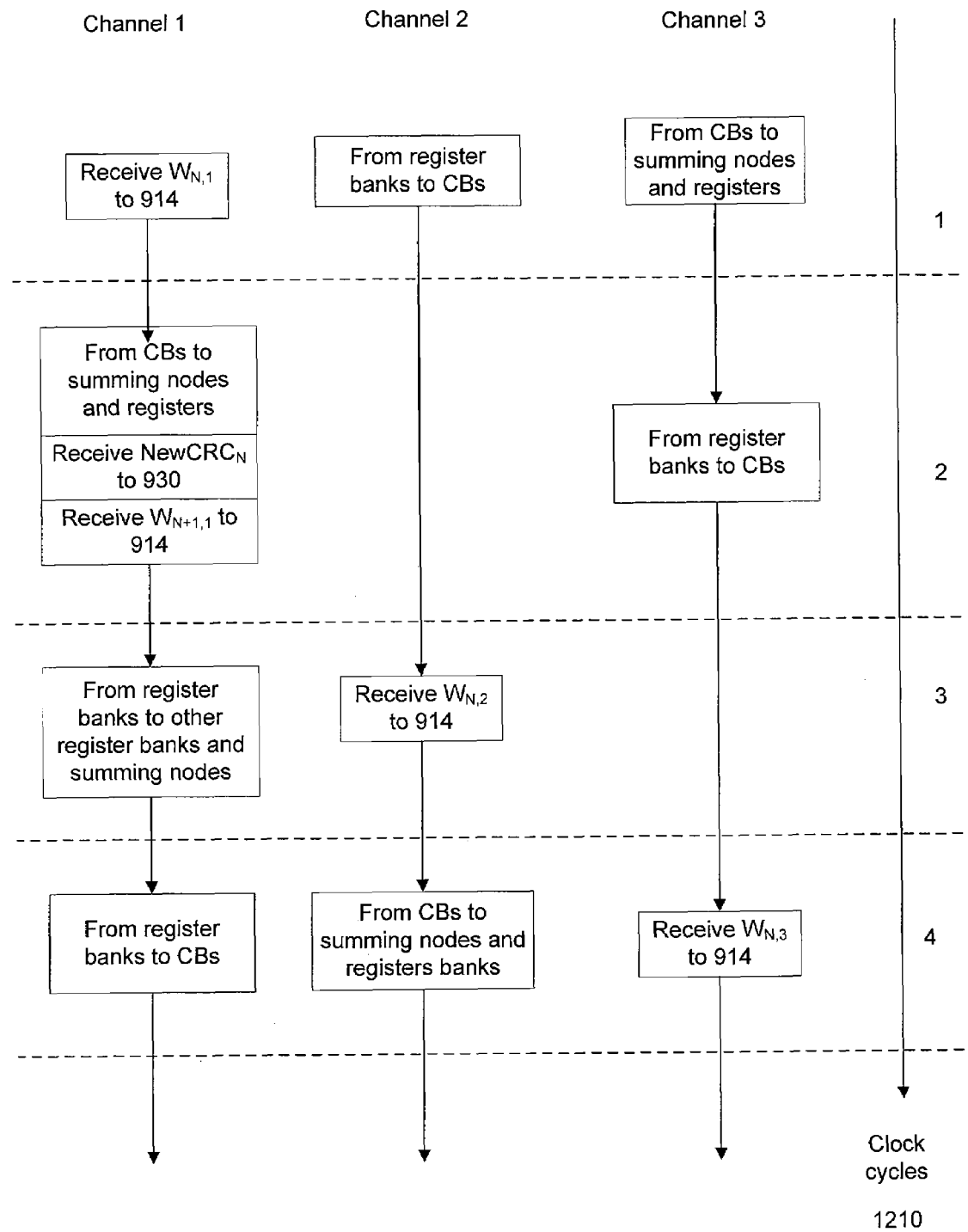
FIG. 12 shows a timing diagram for a circuit receiving an input data stream that has consecutive words from the same channel according to an embodiment of the present invention.

The timing diagrams 1000 and 1100 have input data streams that did not have consecutive words from the same channel. FIG. 12 shows a timing diagram 1200 for a circuit receiving an input data stream that has consecutive words from the same channel according to an embodiment of the present invention. Timing diagram 1200 assumes that sufficient words for each channel have been received prior to clock cycle 1 to fill up the context buffers with the respective state variables. The input data stream is assumed to be . . . , ch2 ($W_{N-1}$), ch3($W_{N-1}$), ch1($W_N$), ch1($W_{N+1}$), ch2($W_N$), ch3 ($W_N$), . . . .

In the 1st clock cycle, the Nth word $W_{N,1}$ for channel 1 is received and a result stored in register 914. For channel 2, state variables are output from the context buffers to summing circuits and registers since a word for channel 2 was received in the previous clock cycle. For channel 3, resultant data is sent from registers (930, 924, 954) to respective context buffers (970, 980, 990).

In the 2nd clock cycle, the feedforward result $FF_{N,1}$ for the Nth word of channel 1 is calculated. The state variables are output from the context buffers to summing circuits and registers since a word for channel 1 was received in the last clock cycle. For instance, CB 980 outputs a feedback result $FB_{N-2,1}$ that is combined with the feedforward result $FF_{N,1}$ at summing circuit 940 to form a new CRC for even terms. The new CRC is stored in register 930. The oldCRC for channel 1 is also output from CB 970 and a result is stored in register 924 at the end of the cycle. Also during this clock cycle, the N+1th word $W_{N+1,1}$ for channel 1 is received and a result stored in register 914.

In the 3rd clock cycle, the old CRC in register 930 is sent through CB 970 and a result eventually is stored in register 924. This is because the channel of the state variable to be output is the same channel as the state variable to be input, which occurs for consecutive words being received from the same channel. Thus, the state variable is allowed to pass right through the context buffer. Additionally, the result $FB_{N-1,1}$ from feedback circuit 920 is sent from register 924 through CB 980 to summing circuit 940, where it is summed with $FF_{N+1,1}$ for channel 1. The result $S_{N,1}$ from scaling circuit 950 is sent from register 954 through CB 990 to summing circuit 960, where it is summed with the result from summing circuit 940 to produce the CRC output. Also, in this clock cycle, the Nth word $W_{N,2}$ for channel 2 is received and a result stored in register 914.

In the 4th clock cycle, for channel 1, resultant data is sent from registers (930, 924, 954) to respective context buffers (970, 980, 990). The state variables do not pass right through the context buffers since the last two received words were from different channels. The process can then continue for other clock cycles.

Figure 13:
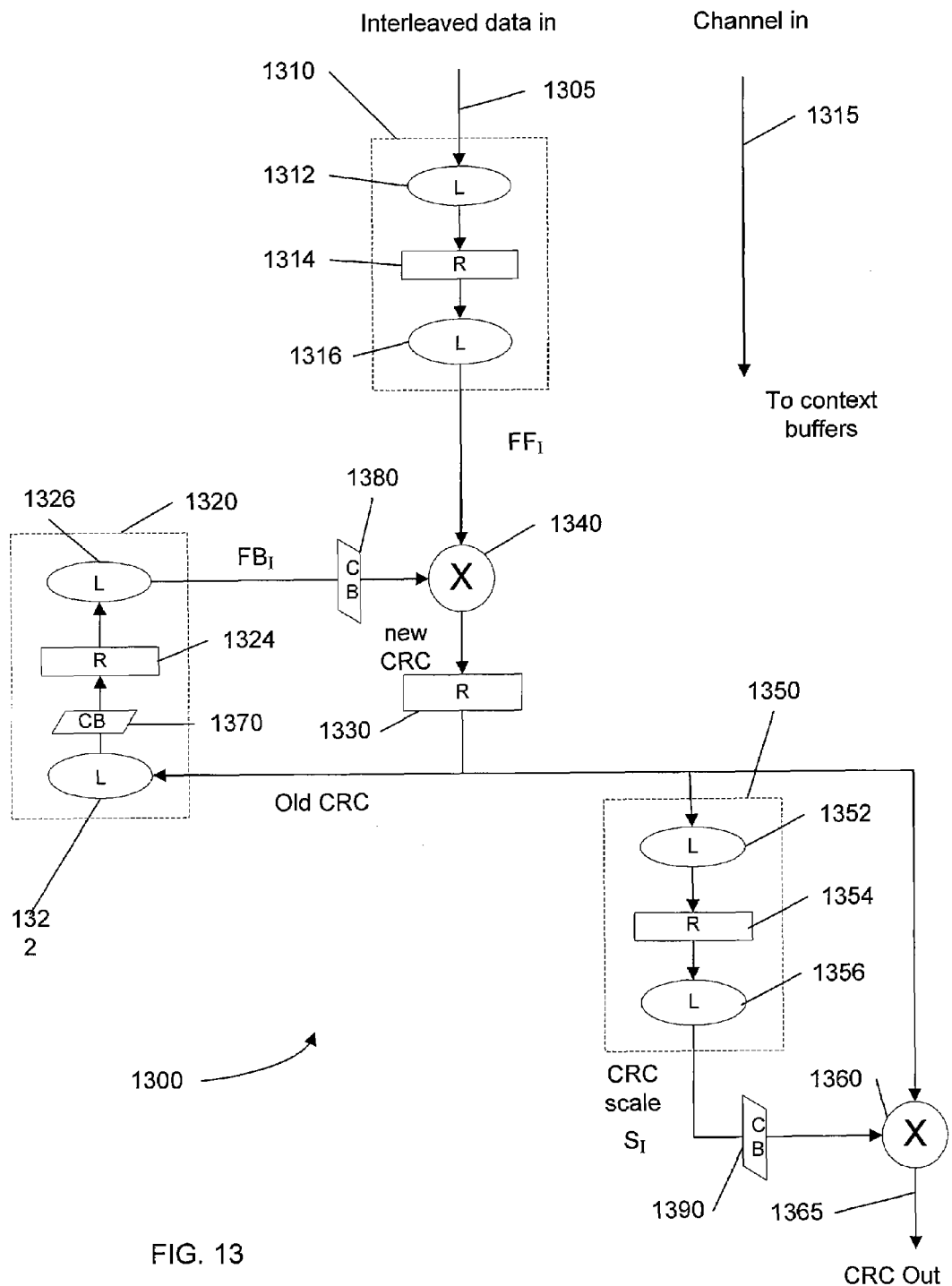
FIG. 13 shows a circuit usable to perform concurrent CRC of multiple channels according to another embodiment of the present invention.

FIG. 13 shows a circuit 1300 usable to perform concurrent CRC of multiple channels according to another embodiment of the present invention. In circuit 1300, scaling circuit 1350 and summing circuit 1360 appear on the other side of the register 1330. A practical effect of this difference from circuit 900 is that the CRC out occurs at one later clock cycle in the pipeline. Additionally, the context channel signal to context buffer 1390 is delayed by one clock signal from the context channel signal to context buffer 1380. Otherwise, the operation of the scaling circuit 1350 and the summing circuit 1360 is the same.

Another difference is that CB 1370 is between combinational logic 1322 and register 1324. Thus, CB 1370 does not store the "old CRC", but a functional result of the "old CRC". In this manner, the work during the clock cycle before the data reaches CB 1370, and after the data leaves CB 1370 is more even. Since the CB 1370 acts to coordinate and to time the state variables for the channels, it does not matter the exact form of the state variables as long as the proper data is calculated and combined at the proper times. In another embodiment, CB 1380 may reside between register 1324 and computational logic 1326. The exact positions of CB 1370, 1380, and 1390 can vary independent of each other.

Figure 14:
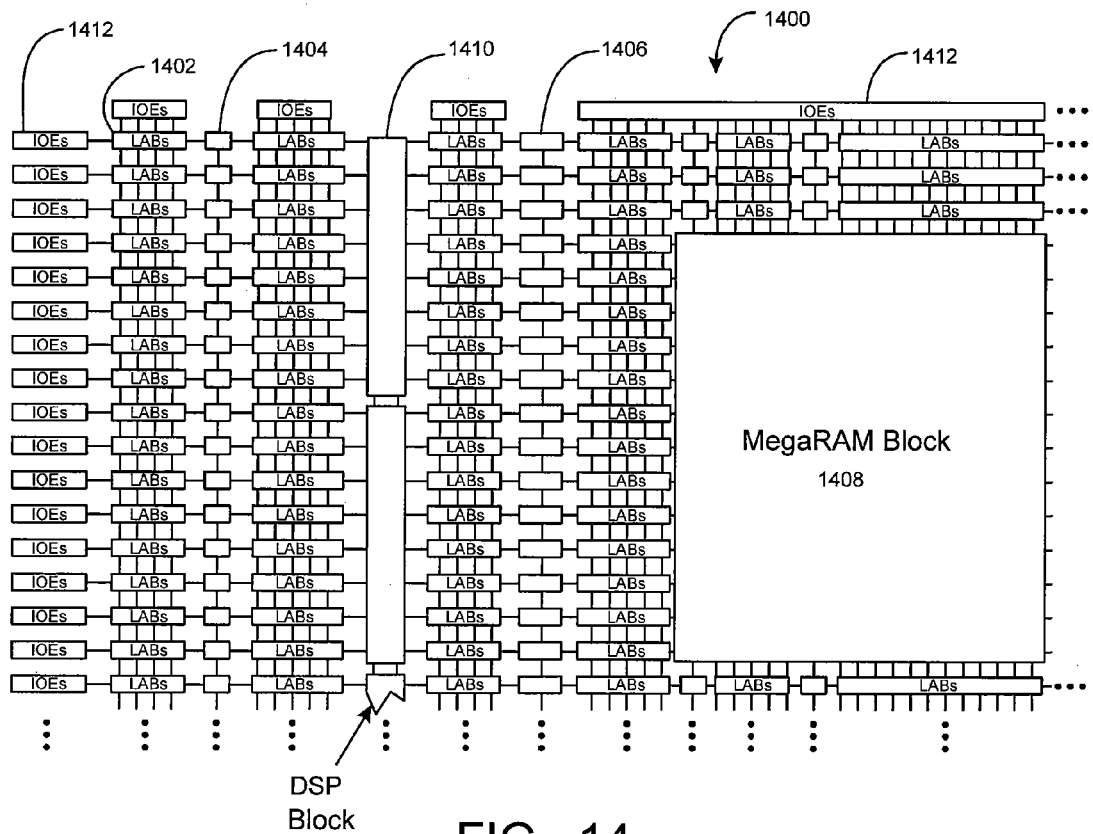
FIG. 14 illustrates a simplified block diagram of a programmable logic device that does benefit by incorporating embodiments of the present invention.

FIG. 14 is a simplified partial block diagram of an exemplary high-density programmable logic device (PLD) 1400 wherein techniques according to the present invention can be utilized. PLD 1400 includes a two-dimensional array of programmable logic array blocks (or LABs) 1402 that are interconnected by a network of column and row interconnections of varying length and speed. LABs 1402 include multiple (e.g., 10) logic elements (or LEs), an LE being a small unit of logic that provides for efficient implementation of user defined logic functions.

PLD 1400 also includes a distributed memory structure including RAM blocks of varying sizes provided throughout the array. The RAM blocks include, for example, 512 bit blocks 1404, 4K blocks 1406 and an M-Block 1408 providing 512K bits of RAM. These memory blocks may also include shift registers and FIFO buffers. PLD 1400 further includes digital signal processing (DSP) blocks 1410 that can implement, for example, multipliers with add or subtract features.

PLD 1400 also includes input/output elements (IOEs) 1412 for providing a communication interface with circuits and devices that are external to PLD 1400. These other circuits or devices may reside on another circuit board, a same circuit board, or even the same chip. It is to be understood that PLD 1400 is described herein for illustrative purposes only and that the present invention can be implemented in many different types of PLDs, FPGAs, and the other types of digital integrated circuits.

Figure 15:
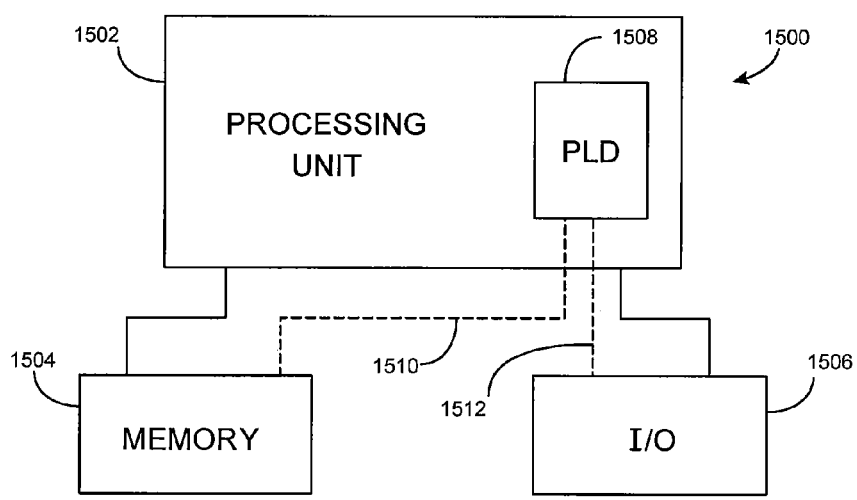
FIG. 15 illustrates a block diagram of an electronic system that does benefit by incorporating embodiments of the present invention.

While PLDs of the type shown in FIG. 14 provide many of the resources required to implement system level solutions, the present invention can also benefit systems wherein a PLD is one of several components. FIG. 15 shows a block diagram of an exemplary digital system 1500, within which the present invention may be embodied. System 1500 can be a programmed digital computer system, digital signal processing system, specialized digital switching network, or other processing system. Moreover, such systems may be designed for a wide variety of applications such as telecommunications systems, automotive systems, control systems, consumer electronics, personal computers, electronic displays, Internet communications and networking, and others. Further, system 1500 may be provided on a single board, on multiple boards, or within multiple enclosures.

System 1500 includes a processing unit 1502, a memory unit 1504 and an I/O unit 1506 interconnected together by one or more buses. According to this exemplary embodiment, a programmable logic device (PLD) 1508 is embedded in processing unit 1502. PLD 1508 may serve many different purposes within the system in FIG. 15. PLD 1508 can, for example, be a logical building block of processing unit 1502, supporting its internal and external operations. PLD 1508 is programmed to implement the logical functions necessary to carry on its particular role in system operation. PLD 1508 may be specially coupled to memory 1504 through connection 1510 and to I/O unit 1506 through connection 1512.

Processing unit 1502 may direct data to an appropriate system component for processing or storage, execute a program stored in memory 1504 or receive and transmit data via I/O unit 1506, or other similar function. Processing unit 1502 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLD 1508 can control the logical operations of the system. In an embodiment, PLD 1508 acts as a reconfigurable processor, which can be reprogrammed as needed to handle a particular computing task. Alternately, programmable logic device 1508 may itself include an embedded microprocessor. Memory unit 1504 may be a random access memory (RAM), read only memory (ROM), fixed or flexible disk media, PC Card flash disk memory, tape, or any other storage means, or any combination of these storage means.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. An integrated circuit including a CRC circuit that receives a plurality of messages, each from one of a plurality of channels, and provides CRC bits for each message, wherein a message is composed of a plurality of words, the CRC circuit comprising:
   a feedforward circuit that serially receives the words of the messages and provides a feedforward result from a received word to a first summing circuit;
   a feedback circuit that is coupled with an output of the first summing circuit and that provides a feedback result to an input of the first summing circuit, wherein the feedback circuit includes a first timing device; and
   a first context buffer having an input coupled with an output of the first timing device and having an output coupled with an input of the first summing circuit, wherein the first context buffer is on a signal path between the first timing device and the summing circuit,
   wherein the first context buffer stores the feedback results for at least two messages of different channels and outputs a feedback result for a specific channel to be summed with a feedforward result for that specific channel.

2. The integrated circuit of claim 1 wherein the feedback circuit includes:
   a first combination logic having an input coupled with the an output of the summing circuit and an output coupled with an input of the first timing device; and
   a second combinational logic having an input coupled with an output of the first timing device and an output coupled with the summing circuit, wherein the first context buffer is between the second combinational logic of the feedback circuit and the first summing circuit.

3. The integrated circuit of claim 1 wherein the first timing device is a register bank having a width equal to a size of the received words.

4. The integrated circuit of claim 1 wherein the feedback circuit includes:
  a first combination logic having an input coupled with the an output of the summing circuit and an output coupled with an input of the first timing device; and
  a second combinational logic having an input coupled with an output of the first timing device and an output coupled with the summing circuit, wherein the first context buffer is between the first timing device and the second combinational logic of the feedback circuit.

5. The integrated circuit of claim 1, further comprising a context channel signal that is coupled with the first context buffer and that identifies which feedback result to output from the first context buffer.

6. The integrated circuit of claim 5 wherein the context channel signal is derived from a detection of the channel of a received word during a first clock cycle, wherein the context channel signal is received by the first context buffer during the first clock cycle, and wherein the feedback result is output in the next clock cycle after the first clock cycle.

7. The integrated circuit of claim 5, further comprising:
  an enable signal coupled with the first context buffer, wherein the enable signal determines whether data is stored in the first context buffer during a specific clock cycle,
  wherein when data is stored during a clock cycle, the context channel signal determines where to store the data.

8. An integrated circuit including a CRC circuit that receives a plurality of messages, each from one of a plurality of channels, and provides CRC bits for each message, wherein a message is composed of a plurality of words, the CRC circuit comprising:
  a feedforward circuit that serially receives the words of the messages and provides a feedforward result from a received word to a first summing circuit;
  a feedback circuit that is coupled with an output of the first summing circuit and that provides a feedback result to an input of the first summing circuit, wherein the feedback circuit includes a first timing device; and
  a first context buffer having an input coupled with the first timing device and having an output coupled with the first summing circuit,
  wherein the first context buffer stores the feedback results for at least two messages of different channels and outputs a feedback result for a specific channel to be summed with a feedforward result for that specific channel, wherein the CRC circuit further comprises:
  a second timing device that receives a first CRC result from the first summing circuit; and
  a second context buffer having an input coupled with the second timing device and having an output coupled with the first timing device, wherein the second context buffer stores the first CRC results for at least two messages of different channels.

9. The integrated circuit of claim 8, wherein the CRC circuit further comprises:
  a scaling circuit that is coupled with an output of the first summing circuit and that provides a scaling result to an input of a second summing circuit, wherein the scaling circuit includes a third timing device; and
  a third context buffer having an input coupled with the third timing device and having an output coupled with the second summing circuit, wherein the third context buffer stores the scaling results for at least two messages of different channels.

10. The integrated circuit of claim 8 wherein the second context buffer is between a first combinational logic of the feedback circuit and the first timing device.

11. An integrated circuit including a CRC circuit that receives a plurality of messages, each from one of a plurality of channels, and provides CRC bits for each message, wherein a message is composed of a plurality of words, the CRC circuit comprising:
  a feedforward circuit that serially receives the words of the messages and provides a feedforward result from a received word to a first summing circuit;
  a feedback circuit that is coupled with an output of the first summing circuit and that provides a feedback result to an input of the first summing circuit, wherein the feedback circuit includes a first timing device; and
  a first context buffer having an input coupled with the first timing device and having an output coupled with the first summing circuit,
  wherein the first context buffer stores the feedback results for at least two messages of different channels and outputs a feedback result for a specific channel to be summed with a feedforward result for that specific channel, wherein the first context buffer outputs a feedback result during a same clock cycle that the feedback result is received, when a current context channel signal has a same value as an immediately previous context channel signal.

12. A method of computing CRCs for a plurality of messages from a plurality of channels, wherein a message is composed of a plurality of words, each associated with the channel of that message, the method comprising:
  serially receiving a plurality of words at a feedforward circuit such that the words of different messages are interspersed with each other;
  for each received word:
    calculating a feedforward result; and
    transmitting the feedforward result to a first summing circuit; and
    transmitting a CRC result from the first summing circuit to a feedback loop having an output coupled with an input of the first summing circuit and having one or more stages, wherein each stage has a corresponding feedback state variable;
  during a clock cycle associated with a current channel:
    providing each of the feedback state variables of a previous channel to a respective context buffer; and
    outputting each of the state variables of the current channel from one of the respective context buffers; and
  summing a final feedback state variable of the current channel with a feedforward result of the current channel to form a first CRC.

13. The method of claim 12, further comprising:
  transmitting the first CRC to a second summing circuit; and
  based on the channel of the first CRC, outputting a scaling state variable from a scaling context buffer, wherein the scaling state variable is associated with a same channel as the first CRC.

14. The method of claim 12, further comprising:
  transmitting a context channel signal to the respective context buffers, wherein the context channel signal carries a channel number value to designate the current channel.

15. The method of claim 12 wherein the clock cycle associated with the current channel is a next clock cycle after a clock cycle in which a word from that current channel is received.

16. The method of claim 12 wherein when the previous channel is a same channel as the current channel, the state variable output from a respective context buffer is a same state variable provided to that respective context buffer during that clock cycle.

17. The method of claim 12, further comprising:
  storing the state variables of the previous channel in the respective context buffers when the previous channel is different from the current channel.

18. The method of claim 17, further comprising:
  transmitting an enable signal to the respective context buffers, wherein when the enable signal has a first value the state variables of the previous channel are not stored.

19. An integrated circuit including a CRC circuit that receives a plurality of messages, each from one of a plurality of channels, wherein a message is composed of a plurality of words, the CRC circuit comprising:
  a feedforward circuit that serially receives words and for each word provides a feedforward state variable to a first summing circuit;
  a feedback loop that is coupled with an output of the first summing circuit and that provides a feedback state variable to an input of the first summing circuit, wherein the feedback loop includes N timing devices and N logic blocks, each logic block producing an Nth state variable; and
  N feedback context buffers, wherein one feedback context buffer is between each of the N timing devices and one feedback context buffer is between the Nth timing device and the first summing circuit,
  wherein each of the N feedback context buffers stores state variables for at least two messages of different channels and outputs a state variable for a specific channel based on a channel indicator, wherein N is a positive integer greater than or equal to one.

20. The integrated circuit of claim 19, wherein the CRC circuit further comprises:
  a scaling circuit that is coupled with an output of the first summing circuit and that provides a scaling result to an input of a second summing circuit, wherein the scaling circuit includes a second timing device; and
  a second context buffer having an input coupled with the second timing device and having an output coupled with the second summing circuit, wherein the second context buffer stores the scaling results for at least two messages of different channels.

21. The integrated circuit of claim 19 where the channel indicator includes a context channel signal that is coupled with the N feedback context buffers and that identifies which feedback result to output from each of the N feedback context buffers.

22. The integrated circuit of claim 19 wherein N equals 2.

* * * * *